US009837391B2

(12) United States Patent
Khare et al.

(10) Patent No.: US 9,837,391 B2
(45) Date of Patent: Dec. 5, 2017

(54) SCALABLE POLYLITHIC ON-PACKAGE INTEGRATABLE APPARATUS AND METHOD

(71) Applicant: Intel Corporation, Santa Clara, CA (US)

(72) Inventors: Surhud Khare, Bangalore (IN); Dinesh Somasekhar, Portland, OR (US); Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 14/967,231

(22) Filed: Dec. 11, 2015

(65) Prior Publication Data

US 2017/0170153 A1    Jun. 15, 2017

(51) Int. Cl.
| | |
|---|---|
| *H01L 23/48* | (2006.01) |
| *H01L 25/10* | (2006.01) |
| *H01L 25/00* | (2006.01) |
| *H01L 23/538* | (2006.01) |
| *G06F 1/12* | (2006.01) |
| *H01L 23/522* | (2006.01) |
| *H01L 23/528* | (2006.01) |
| *G06F 13/40* | (2006.01) |
| *H04L 12/933* | (2013.01) |

(52) U.S. Cl.
CPC .............. *H01L 25/105* (2013.01); *G06F 1/12* (2013.01); *G06F 13/4022* (2013.01); *H01L 23/528* (2013.01); *H01L 23/5221* (2013.01); *H01L 23/5386* (2013.01); *H01L 25/50* (2013.01); *H04L 49/101* (2013.01)

(58) Field of Classification Search
CPC ......... H04L 45/60; H04L 45/72; H04L 47/33; H04L 49/109; H04L 23/5386
See application file for complete search history.

(56) References Cited

U.S. PATENT DOCUMENTS

| | | | |
|---|---|---|---|
| 8,347,005 | B2 | 1/2013 | Bresniker |
| 2007/0208901 | A1 | 9/2007 | Purcell et al. |
| 2012/0179878 | A1 | 7/2012 | Sistla et al. |
| 2014/0095923 | A1* | 4/2014 | Alvarez-Icaza Rivera ............... G06F 11/2005 714/4.2 |

(Continued)

FOREIGN PATENT DOCUMENTS

WO    2014100090    6/2014

OTHER PUBLICATIONS

International Search Report and Written Opinion for Patent Application PCT/US2016/059962, dated Feb. 15, 2017.

*Primary Examiner* — A. Sefer
(74) *Attorney, Agent, or Firm* — Green, Howard and Mughal LLP

(57) ABSTRACT

Described is an apparatus which comprises: a first die including: a processing core; a crossbar switch coupled to the processing core; and a first edge interface coupled to the crossbar switch; and a second die including: a first edge interface positioned at a periphery of the second die and coupled to the first edge interface of the first die, wherein the first edge interface of the first die and the first edge interface of the second die are positioned across each other; a clock synchronization circuit coupled to the second edge interface; and a memory interface coupled to the clock synchronization circuit.

17 Claims, 10 Drawing Sheets

(56) References Cited

U.S. PATENT DOCUMENTS

2014/0177626 A1* 6/2014 Thottethodi ........ G06F 17/5068
　　　　　　　　　　　　　　　　　　　370/351
2014/0266416 A1    9/2014 Dally et al.
2016/0173074 A1* 6/2016 Chen ...................... H03K 5/135
　　　　　　　　　　　　　　　　　　　365/233.11

* cited by examiner

SCALABLE POLYLITHIC ON-PACKAGE INTEGRATABLE APPARATUS AND METHOD

GOVERNMENT LICENSE RIGHTS

This invention was made with Government support under contract number B608115 awarded by the Department of Energy. The Government has certain rights in this invention.

BACKGROUND

With significant number of workloads now migrating to a data center or cloud, there is an increasing trend of providing customized or workload optimized silicon solutions for data centers, to achieve the highest system-level energy-efficiency while minimizing Total Cost of Ownership (TCO). However, there are several technical and economic challenges from the perspective of silicon development to provide customized or workload optimized silicon solutions for data centers, and to achieve the highest system-level energy-efficiency while minimizing TCO.

For example, design, development, and manufacturing of such highly customized silicon chips incur very high Non-Recurring Engineering (NRE) cost and have long lead times from concept to production. Further, requirements and characteristics of targeted set of workloads keeps continuously evolving and expanding, which makes the goal of optimizing silicon solutions for data centers a moving target. Moreover, different classes of workloads often have disparate demands for key platform characteristics such as per-socket core count, memory and interconnect bandwidth, etc.

Developing fully-integrated/monolithic point solutions for each class of workload is therefore not scalable and sustainable. A superset solution with over-provisioned memory and interconnect bandwidths, large number of processing cores, and plethora of workload specific accelerators all integrated on a large monolithic silicon is not a cost effective approach either.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
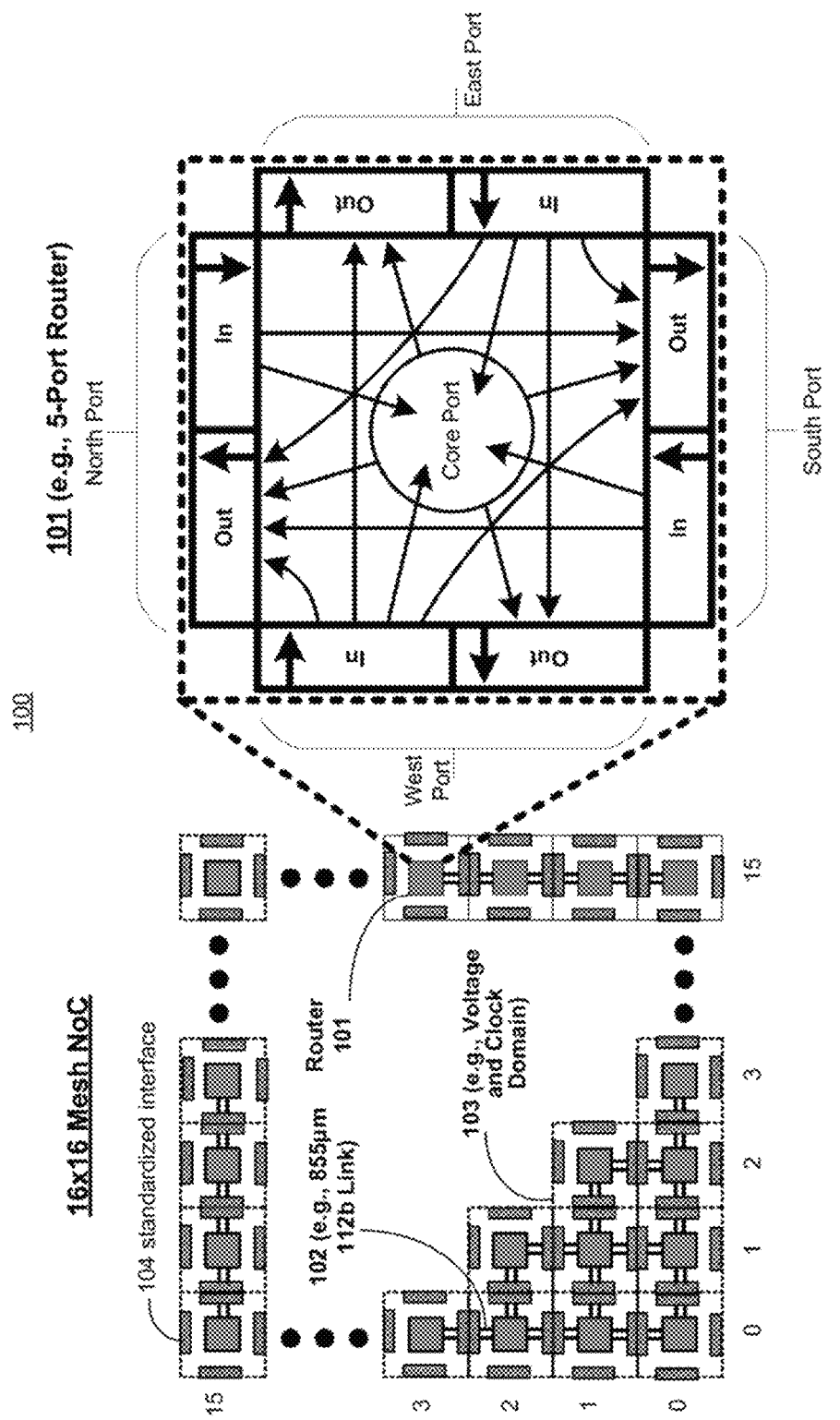
FIG. 1 illustrates a Network-on-Chip (NoC) with routers having a standardized communication interface, according to some embodiments of the disclosure.

Server-class processors typically have very high core count, for example, in the order of 10's or 100's processing cores and workload specific accelerators along with large number of memory/network input-output circuits (IOs), all integrated on a large monolithic die. The term "monolithic die" here generally refers to a silicon die having electronic circuit(s) fabricated on it such that the electronic circuits have a single semiconductor base material (e.g., Silicon Substrate) and the die forms a single chip. For example, processing cores, accelerators, and IOs are interconnected using a network-on-chip (NoC) fabric—which is very regular, symmetric and hierarchical structure designed to achieve performance scalability and ease of design implementation—and fabricated on a monolithic die forming a single chip.

With a monolithic implementation, it is possible to provide very high communication bandwidth across an entire die due to availability of abundant on-die interconnect resources (e.g., metal wires). However, usable bandwidth is often limited by energy constraints, and therefore cannot be uniform across the entire die. For example, the usable bandwidth is higher between nearest-neighbor processing cores and is tapered between processing cores that are physically farther apart on the monolithic die.

Various embodiments describe apparatuses and methods to achieve significantly higher scalability, flexibility, and configurability in customization of server processors, allowing development of workload-specific skews with significantly less development cost and much faster turnaround time. The apparatuses of various embodiments make it possible to achieve higher yield with smaller die size, resulting in additional savings in manufacturing cost. Unlike monolithically integrated chips, each of the building blocks of some embodiments, either logic chips or input-output (IO) chips, can be independently optimized and designed on appropriate process nodes to achieve the right balance of power, performance, and cost. The functionalities of the logic chips or IO chips can also be upgraded independently, without having to redesign or manufacture other building blocks, in accordance with some embodiments. In some embodiments, by partitioning of logic and IO into separate dies enables flexible implementation where compute-to-IO ratio can be easily adjusted as per application requirements.

Some embodiments provide polylithic (on-package) integration of smaller, heterogeneous building blocks such as processor chips (with smaller core count), accelerator chips, memory/network IO chips, each having standardized communicating interfaces that are interconnected via a scalable network-on-package (NoP). As such, a polylithic integratable die is formed. The term "polylithic integration" here generally refers to a combination of such polylithic integratable, heterogeneous dies having electronic circuit(s) fabricated on them and interconnected, packaged together on a single package, where the dies may be associated with different or the same process technology nodes.

Some embodiments use advanced packaging and interconnect technologies such as silicon interposers, Embedded Interconnect Bridge (EMIB), or energy-efficient on-package signaling links to accomplish such network-on-package (NoP) connectivity with energy, usable bandwidth, and latency characteristics comparable to that of monolithic NoC implementation. In some embodiments, the standardized chip interfaces and scalable NoP can enable construction of large number of socket-level configurations with variable number of compute and/or accelerator chips, each with variable number of memory/network IO chips.

Various embodiments enable partitioning of large die functionality into multiple polylithic integratable smaller dies, with standardized network interfaces and EMIB (or such package interconnect) allowing high-bandwidth edge connectivity of multiple dies on a same package. In some embodiments, the standardized network interfaces are inverter and/or buffer drivers which provide a simple and efficient scheme for transmitting data.

There are many technical effects of the various embodiments. For example, the apparatuses and methods of various embodiments allow for easy scalability of core count (e.g., number of processing cores), memory bandwidth, and network bandwidth. In some embodiments, the non-recurring engineering and development cost of package-level design and integration is an order of magnitude lesser than that of monolithic chip design in advanced technology nodes. Other technical effects will be evident from the various embodiments and figures described here.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Here, the term "layout floorplan" generally refers to a representation of placement of electrical components, such as circuits, wires, ports, in an area of an integrated circuit (IC). The term "scalable layout floorplan" generally refers to the ability to increase or decrease, relative to one or more performance parameters (such as propagation delay, power, etc.), the x/y dimension(s) of the layout floorplan and/or the ability to increase or decrease, relative to one or more performance parameters, a number of electrical components associated with the IC. For example, increasing the number of radix crossbar ports 'p' and/or the width of data bus 'd' associated with the ports increases the interconnect power consumption of the crossbar quadratically, which means the interconnect power consumption associated with the crossbar layout floorplan scales quadratically with increase in 'p' and/or 'd.'

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates NoC 100 with routers and standardized communication interfaces for each die in NoC 100, according to some embodiments of the disclosure. In some embodiments, NoC 100 comprises a network of Routers 101 (or crossbar switches or circuits) coupled together via links 102 (e.g., 1500 μm long 3000-bit link which is 3000 bits wide), where each router of Routers 101 is part of a die and is coupled to a standardized edge interface for coupling to other routers of another die. In some embodiments, Routers 101 have a scalable layout floorplan.

Crossbar switches 101 (which are also referred to as crossbar circuits, cross-point switches, matrix switches, coordinate switching circuits, crossbars, routers, etc.) are a collection of switches or multiplexers which are typically arranged in a matrix configuration. A crossbar switch has multiple input and output lines that form a crossed pattern of interconnecting lines between which a connection may be established by closing a switch located at each intersection.

For example, if the crossbar switch has 'M' input lines and 'N' output lines, then the crossbar/router has a matrix with M×N cross-points or places where the connections cross. At each cross-point is a crossbar switch, and when the switch is closed, the switch connects one of the input lines to one of the output lines. Typically, concurrent connections in the crossbar switches do not prevent connecting other input lines to other output lines.

Energy-efficient, high-performance crossbar circuits are used for efficient on-chip communication. On-chip communication limits processor performance and power, and is becoming increasingly crucial because of process scaling and core-count increases, where core-count are count of processing elements (e.g., cores, caches, memory controllers, etc.). Crossbars enable data exchange among a set of ports having input and output lines. Crossbars may directly connect processing elements (e.g., compute cores, accelerator cores, etc.) to each other in a full crossbar. Or, crossbars may be networked to relay data between cores using a series of router switches.

In some embodiments, NoC 100 forms a routing network for processing elements 103 (e.g., intellectual property (IP) cores such as processors, memories, graphic units, etc.) in an integrated circuit (IC) or a computer system.

ICs have traditionally used point-to-point interconnects where one wire is dedicated to a signal. Such traditional interconnections (and others such as shared buses or segmented buses with bridges) are not efficient with reference to one or more performance parameters such as power consumption and signal propagation speed, especially for large IC designs. On-chip communication is a performance and power limiter for multi-core processors. To enable communication between processing elements (such as processing elements 103), high performance, energy-efficient crossbar circuits are desired. NoCs can alleviate such physical limitations of traditional interconnections by providing wires in links that are shared by many signals. As such, a high level of parallelism is achieved with higher throughput and scalability. In some embodiments, all links 102 in NoC 100 can operate via Routers 101 simultaneously on different data packets.

In some embodiments, NoC 100 can span synchronous and asynchronous clock domains. For example, some processing elements 103 may generate synchronous output signals while some processing elements 103 may generate asynchronous signals, both of which can be exchanged between various processing elements via NoC 100. In some embodiments, NoC 100 manages the synchronization of data signals over links 102 by clocking the data output of the multiplexers of the crossbar circuits. In some embodiments, NoC 100 design is asynchronous which allows for power savings when the links 102 are idle (i.e., signals on the links are not toggling) and/or Router 101 is idle.

In some embodiments, NoC 100 relays data between processing elements 103 using a mesh of Routers 101 and associated wires/links 102. Here, the topology of NoC is illustrated as a mesh topology. However, the embodiments are not limited to mesh topologies. For example, topologies such as ring, star, tree, fat tree, butterfly, torus, etc. can be used for NoC 100. In some embodiments, topologies of NoC 100 can be designed to reduce latency and provide greater connectivity. For example, NoC 100 may use wide data busses (e.g., 512 bits to 1024 bits) for its ports to improve network throughput. A zoomed version of one possible Router 101 is shown on the right side of FIG. 1.

In this example, a 5-port Router is shown. However, the embodiments are not limited to 5-port routers. For example, various embodiments are applicable for 3-port, 4-port, 6-port, etc. routers. Continuing with the example of 5-port Router 101, in some embodiments, 5-port Router 101 comprises five ports—South Port, North Port, East Port, West Port, and Core Port. Each port includes wires (e.g., 112 bits, 512 bits, 1024 bits, etc.) for input and output.

The term "port" here generally refers to a hardware port. This hardware port is not pure software. The hardware port may comprise a wire interface for supporting a number of bits for input and/or output. For example, the wire interface may support 112 bits, 512 bits, 1024 bits, etc. for input and output. In some embodiments, the hardware port comprises more than a wire interface for information signals. For example, the wire interface may include interface for power and/or ground lines. The hardware port, if appropriate, may also include more than just a wire interface.

In some embodiments, North, South, East, and West Ports are used to communicate with other routers of NoC 100 and with its own ports. In some embodiments, Core Port is used to communicate with local logic (e.g., processing element 103 in close proximity to Core Port) and with the North, South, East, and West Ports. The network of wires shown in the center of 5-port Router 101 are managed or multiplexed by crossbar circuits (within Router 101) which are arranged in a scalable floorplan, according to some embodiments.

In some embodiments, the crossbar circuit comprises one or more multiplexers (e.g., 2:1, 4:1, 8:1, etc. multiplexers) which are arranged such that signals on the interconnects extending in the x-direction are routed before signals on the interconnects extending in the y-direction. Such routing is referred to as x-first and y-second routing. One technical effect of such routing is to avoid deadlocks in data propagation. In some embodiments, the crossbar circuit comprises one or more multiplexers which are fully connected. A fully connected crossbar may have connections from all inputs to all outputs. Router 101 is not fully connected because, for example, in the x-first and y-second routing there are no connections from a North/South port to an East/West port.

In some embodiments, the dotted box indicating voltage and/or clock domain around each router is a die boundary (which is a periphery of a die). In some embodiments, the die includes a processing element 103 (e.g., one or more processing cores), crossbar switch (or router) 101, within die interconnects or communication fabric 102 (also referred to as link), and standardized interfaces 104. In some embodiments, the dies within NoC 100 are separated by short distances from one another. For example, the distance between the dies is less than 100s of microns apart.

In some embodiment, standardized edge interfaces 104 are positioned along the periphery of the die to allow the die to communicate with other dies over a short distance using on-package (or package-level) interconnects such as high-density interposers and Embedded Interconnect Bridge (EMIB) by Intel Corporation of Santa Clara, Calif. In other embodiments, other type of package-level interconnects may be used that provide high connection bandwidth density (e.g., greater than 1 Giga-Bytes per second per millimeter).

In some embodiments, standardized edge interfaces 104 are implemented as inverters and/or buffers. In some embodiments, standardized edge interfaces 104 are simple circuits that do not require high-speed signaling interfaces or protocols because the communication distances are 100s of micros apart. As such, standardized edge interfaces 104 result in low power consumption, in accordance with some embodiments.

Figure 2:
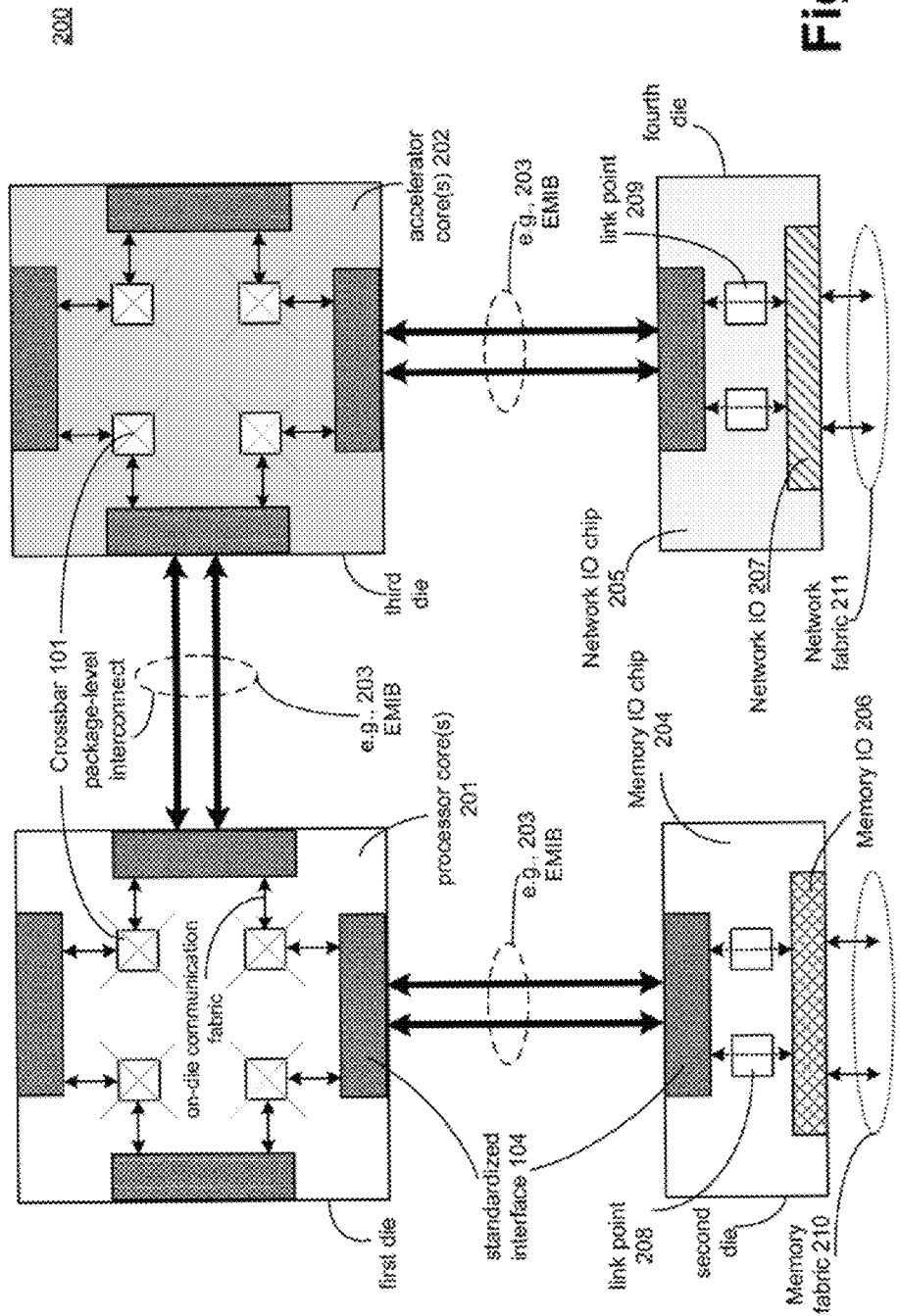
FIG. 2 illustrates an apparatus configuration with building blocks of NoCs coupled together via the standardized communication interface, in accordance with some embodiments of the disclosure.

FIG. 2 illustrates apparatus configuration 200 with building blocks of NoCs coupled together via the standardized communication interface, in accordance with some embodiments of the disclosure. It is pointed out that those elements of FIG. 2 having the same reference numbers (or names) as the elements of any other figure can operate or function in any manner similar to that described, but are not limited to such.

In some embodiments, the building blocks for making various NoC configurations include dies (e.g., first die, second die, third die, and fourth die) and package-level interconnects coupling the dies. In some embodiments, each of these building blocks integrate the standardized edge interfaces 104 for network-on-package (NoP) connectivity.

For example, the first die includes processor core(s) 201 (e.g., computer cores), crossbar switch(es) 101, on-die communication fabric, and standardized edge interface(s) 104. In some embodiments, the on-die communication fabric is a network of interconnects coupling the processor core(s) 201, crossbar switch(es) 101, and standardized edge interface(s) 104.

In some embodiments, the second die is a memory IO chip 204 which includes link-level clock domain synchronization circuit(s) 208 (also referred to as clock synchronization circuits), on-die communication fabric, standardized edge interface(s) 104, and memory IO interface 206. In some embodiments, the on-die communication fabric is a network of interconnects coupling logic and circuits of memory IO chip with link-level clock domain synchronization circuit(s) 208, and standardized edge interface(s) 104. In some embodiments, clock synchronization circuit(s) 208 enable clock domain transitions across memory IO interface 206 and the standardized edge interface(s) 104.

In some embodiments, Memory IO 206 has IO drivers and receivers that comply with any known or proprietary IO standard. For example, Memory IO 206 is capable to communicate with a memory via Memory fabric 210 using Double Data Rate (DDR) fourth generation as defined by the Joint Electron Device Engineering Council (JEDEC) Solid State Technology Association, Low Power DDR (LPDDR), and/or other memory communication fabrics etc.

In some embodiments, the third die includes accelerator core(s) 202, crossbar switch(es) 101, on-die communication fabric, and standardized edge interface(s) 104. In some embodiments, the on-die communication fabric is a network of interconnects coupling the accelerator core(s) 202, crossbar switch(es) 101, and standardized edge interface(s) 104.

In some embodiments, the fourth die is a Network IO chip 205 which includes link-level clock domain synchronization circuit(s) 209, on-die communication fabric, standardized edge interface(s) 104, and Network IO interface 207. In some embodiments, the on-die communication fabric is a network of interconnects coupling logic and circuits of Network IO chip 205 with link-level clock domain synchronization circuit(s) 209, and standardized edge interface(s) 104.

While various embodiments are described with reference to these four building blocks, the embodiments are not limited to these building blocks. Any number and kind of building blocks with standardized edge interfaces can be used to form any configuration of building blocks in a NoC.

In some embodiments, Network IO 207 has IO drivers and receivers that comply with any known or proprietary IO standard. For example, Network IO 207 is capable to communicate via Ethernet, Peripheral Component Interconnect Express (PCIe) based interconnect as described by PCIe Express 4.0 released Nov. 29, 2011, and/or Optical interconnects. In some embodiments, Network IO 207 is coupled to Network fabric 211 (e.g., fabric which complies with Ethernet, PCIe, Optical, communication fabrics).

In some embodiments, the first die having processor core(s) 201 is coupled to the second die (e.g., Memory IO chip 204) via package-level interconnect 203 (e.g., EMIB or other high density interposers). In some embodiments, package-level interconnect 203 is coupled to standardized edge interfaces 104 of the respective dies. For example, package-level interconnect 203 is coupled to standardized edge interfaces 104 of the first and second dies, where the standardized edge interfaces 104 are positioned such that they face each other. As such, the direct and shortest routing is achieved between standardized edge interfaces 104, in accordance with some embodiments.

In some embodiments, the third die having accelerator core(s) 202 is coupled to the fourth die (e.g., Network IO chip 205) via package-level interconnect 203 (e.g., EMIB or other high density interposers). For example, package-level interconnect 203 is coupled to standardized edge interfaces 104 of the third and fourth dies, where the standardized edge interfaces 104 are positioned such that they face each other. In some embodiments, the first and third dies are also coupled via package-level interconnect 203. For example, package-level interconnect 203 is coupled to standardized edge interfaces 104 of the first and third dies, where the standardized edge interfaces 104 are positioned such that they face each other.

As such, various dies are coupled to each other by package-level interconnect 203 via their respective standardized edge interfaces 104, in accordance with some embodiments. In some embodiments, these standardized edge interfaces 104 allow the on-die fabric of the respective dies to couple to the crossbar switches of those dies, and the crossbar switches allow the on-die fabric to couple to various processing cores of that die. While various embodiments are illustrated with dies as having multiple processing/accelerator cores and multiple crossbar switches, a die may have a single processing core and a single crossbar switch in some embodiments. In one such embodiment, the crossbar switch is coupled to a standardized edge interface 104 to allow that die to communicate with other die(s) of the NoC.

In some embodiments, compute-chip (e.g., first die having processor core(s) 201) and accelerator chip (e.g., third die having accelerator core(s) 202) have hierarchical NoC fabric. In some embodiments, the Memory IO chip 204 (e.g., second die) and Network IO chip 205 (e.g., fourth die) integrate similar NoP/NoC interfaces, IO controllers and analog physical (PHY) circuits.

In some embodiments, the hierarchical NoC allows network scalability beyond the chip, extending at a NoP level. In some embodiments, the higher-level NoC routers (not shown) provide off-chip connectivity to the NoP. In some embodiments, the NoP connectivity can be accomplished through either silicon interposers, EMIB or on-package interconnect links as discussed here.

In some embodiments, the first, second, third, and fourth dies share a silicon substrate. For example, the first, second, third, and fourth dies have the same substrate type or fabricated on the same substrate. In some embodiments, at least one of the first, second, third, and fourth dies have separate substrates. For example, first die may be formed on a high threshold Vt process node while the second may be formed on a low threshold Vt process node. In some embodiments, the first, second, third, and fourth dies are packaged in a single package.

FIGS. 3-7 illustrate various configurations of the building blocks described with reference to FIG. 2 to form polylithic integrated chip, according to various embodiments of the disclosure. It can be observed that scaling up core count, incorporation of additional accelerators, or adjustment of memory/interconnect bandwidths according to targeted workload requirements can be accomplished by appropriately instantiating and interconnecting these basic building blocks on the package. As such, the apparatuses of various embodiments make it possible to achieve higher yield with smaller die size, resulting in additional savings in manufacturing cost.

Figure 3:
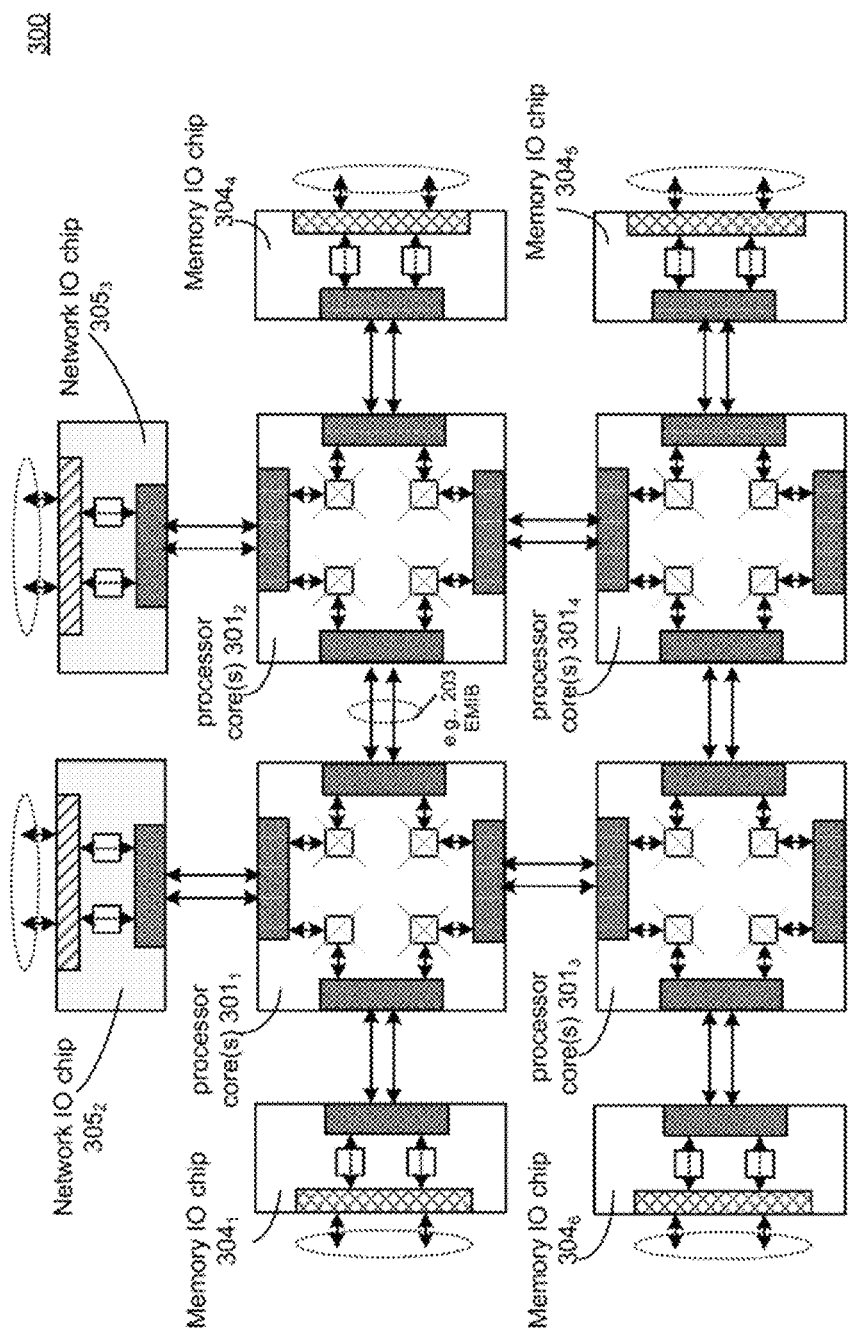
FIG. 3 illustrates an apparatus showing a 4:4:2 (Core: Memory:Network) configuration, in accordance with some embodiments of the disclosure.

FIG. 3 illustrates apparatus 300 showing a 4:4:2 (Core:Memory:Network) configuration, in accordance with some embodiments. It is pointed out that those elements of FIG. 3 having the same reference numbers (or names) as the elements of any other figure can operate or function in any manner similar to that described, but are not limited to such.

In some embodiments, apparatus 300 comprises four NoCs with processing cores $301_{1-4}$ (e.g., first dies) and a combination of four Memory IO chips $304_1$, $304_4$, $304_5$, and $304_6$ (e.g., second dies) and two Network IO chips $305_2$ and $305_3$ (e.g., fourth dies) along the periphery of the NoCs with processing cores. In some embodiments, the various dies are coupled together via package-level interconnect 203 as shown.

Figure 4:
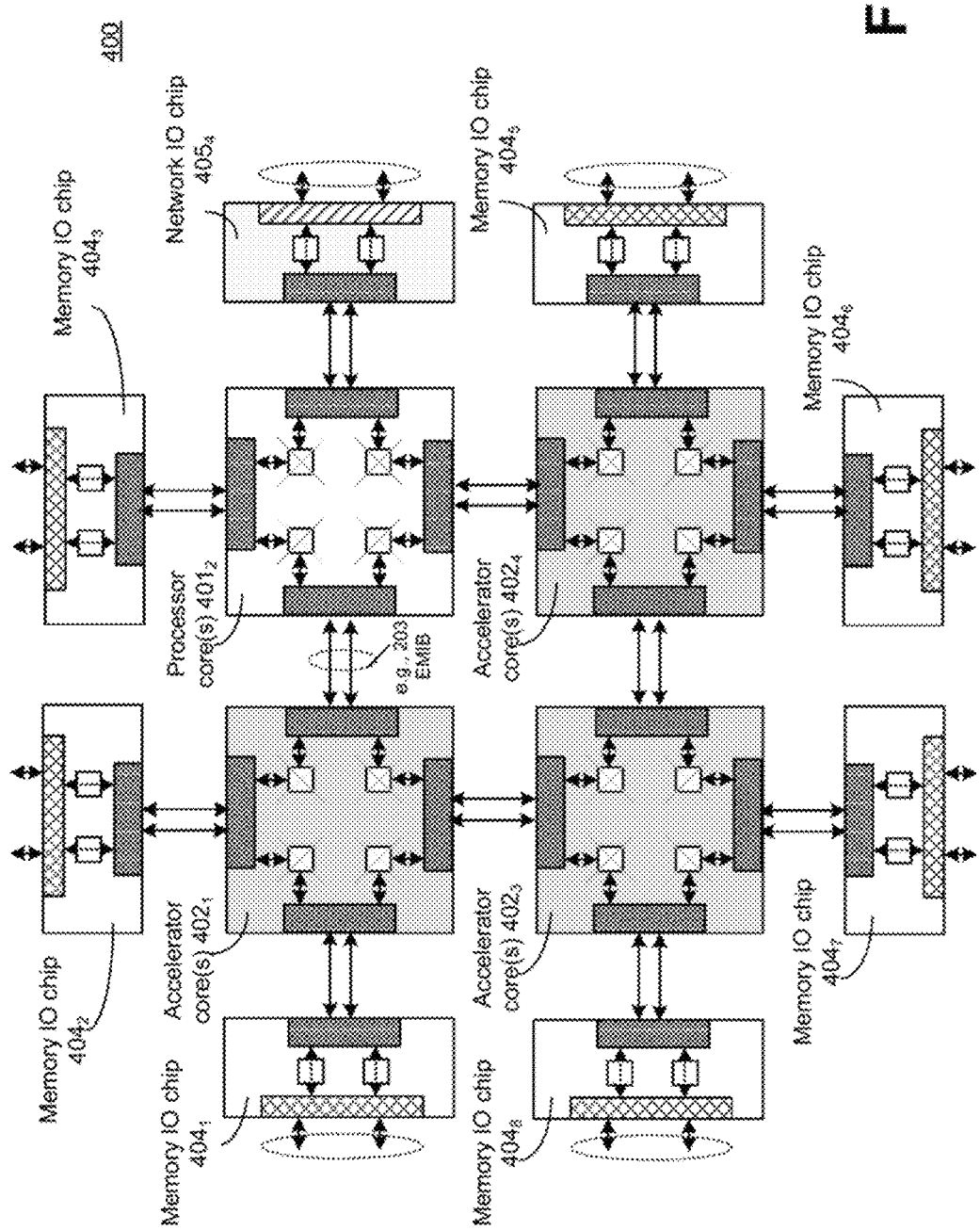
FIG. 4 illustrates an apparatus showing a 4:7:1 configuration, in accordance with some embodiments of the disclosure.

FIG. 4 illustrates apparatus 400 showing a 4:7:1 configuration, in accordance with some embodiments. It is pointed out that those elements of FIG. 4 having the same reference numbers (or names) as the elements of any other figure can operate or function in any manner similar to that described, but are not limited to such.

In some embodiments, apparatus 400 comprises four NoCs with three accelerator cores $402_1$, $402_3$, and $402_4$ (e.g., third dies), one processor core $401_2$ (e.g., first die), and a combination of seven Memory IO chips $404_1$, $404_2$, $404_3$, $404_5$, $404_6$, $404_7$, and $404_8$, and one Network IO chip $405_4$ (e.g., fourth die) coupled together as shown. In some embodiments, the various dies are coupled together via package-level interconnect 203 as shown.

Figure 5:
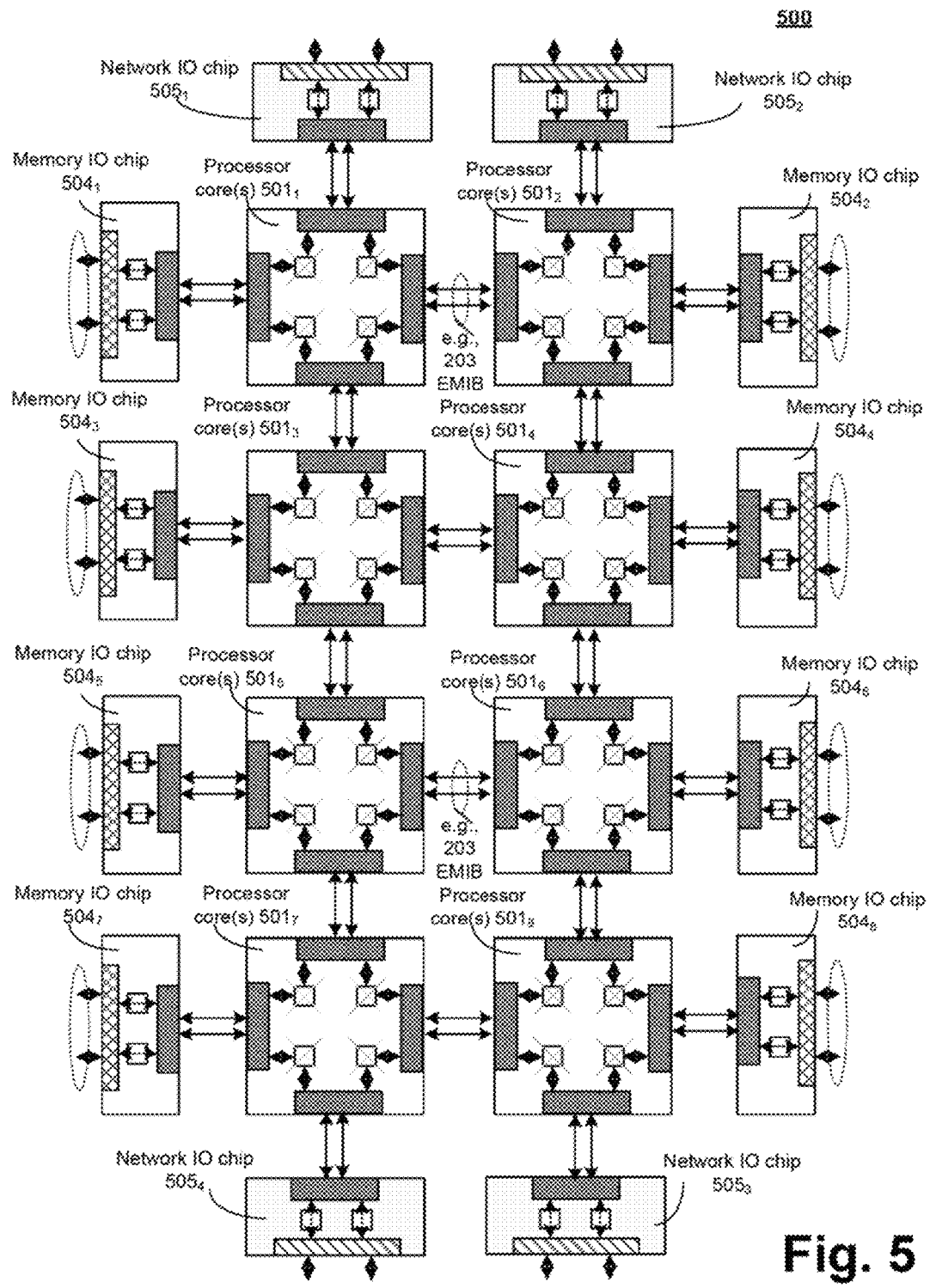
FIG. 5 illustrates an apparatus showing a 8:8:4 configuration, in accordance with some embodiments of the disclosure.

FIG. 5 illustrates apparatus 500 showing an 8:8:4 configuration, according to some embodiments. It is pointed out that those elements of FIG. 5 having the same reference numbers (or names) as the elements of any other figure can operate or function in any manner similar to that described, but are not limited to such. FIG. 5 is scaled-up version of FIG. 3.

In some embodiments, apparatus 500 comprises eight NoCs with processing cores $501_{1-8}$ (e.g., first dies) and a combination of eight Memory IO chips $501_{1-8}$ (e.g., second dies) and four Network IO chips $505_{1-4}$ (e.g., fourth dies) along the periphery of the NoCs with processing cores. In some embodiments, the various dies are coupled together via package-level interconnect 203 as shown.

Figure 6:
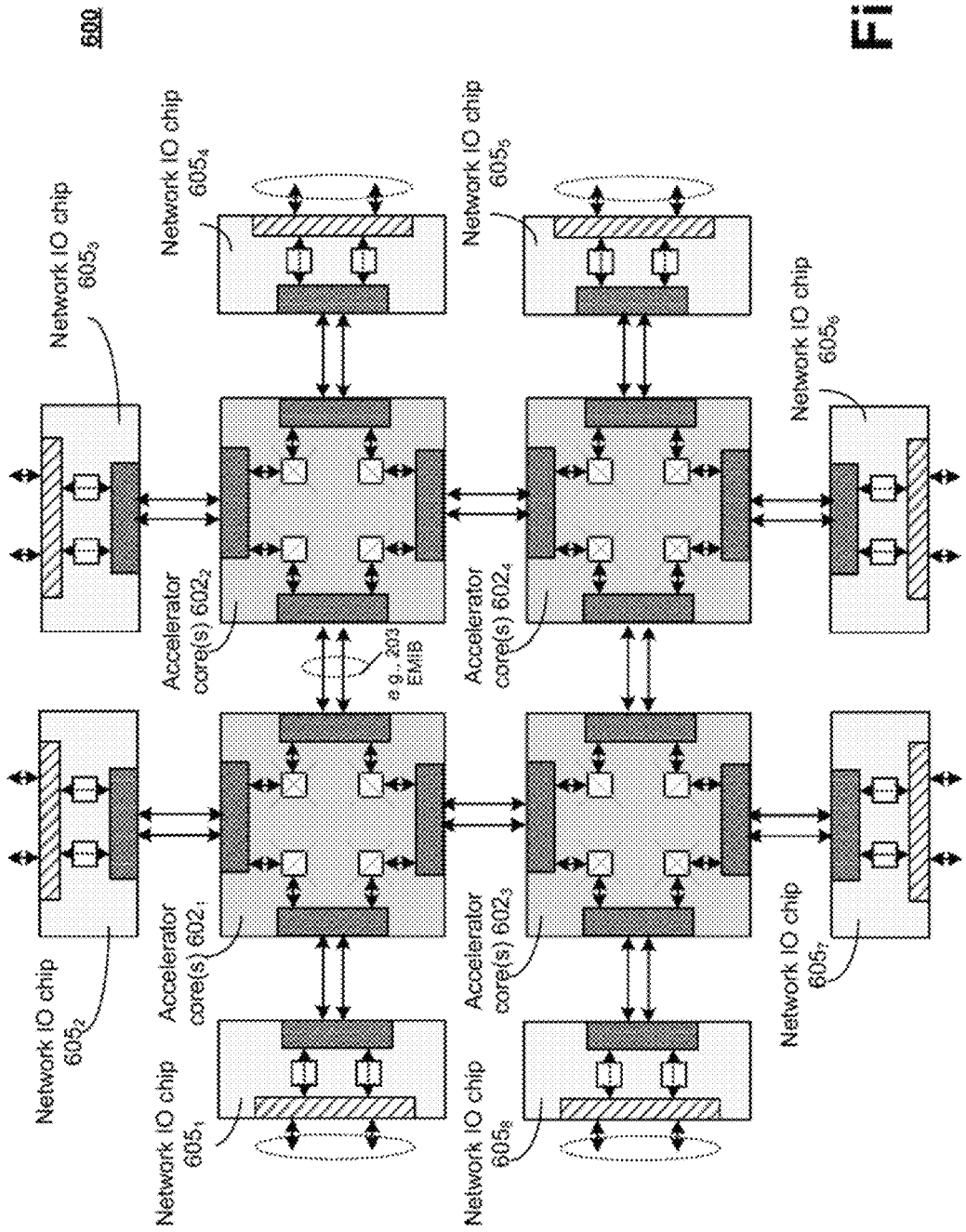
FIG. 6 illustrates an apparatus showing a 4:0:8, in accordance with some embodiments of the disclosure.

FIG. 6 illustrates apparatus 600 showing a 4:0:8 switch configuration, according to some embodiments of the disclosure. It is pointed out that those elements of FIG. 6 having the same reference numbers (or names) as the elements of any other figure can operate or function in any manner similar to that described, but are not limited to such.

In some embodiments, apparatus 600 is a switch configuration which includes four NoCs with accelerator cores $602_{1-4}$ (e.g., third dies), no Memory IO chips, and eight Network IO chips $605_{1-8}$ along the periphery of the NoCs coupled together as shown. In some embodiments, the various dies are coupled together via package-level interconnect 203 as shown.

Figure 7:
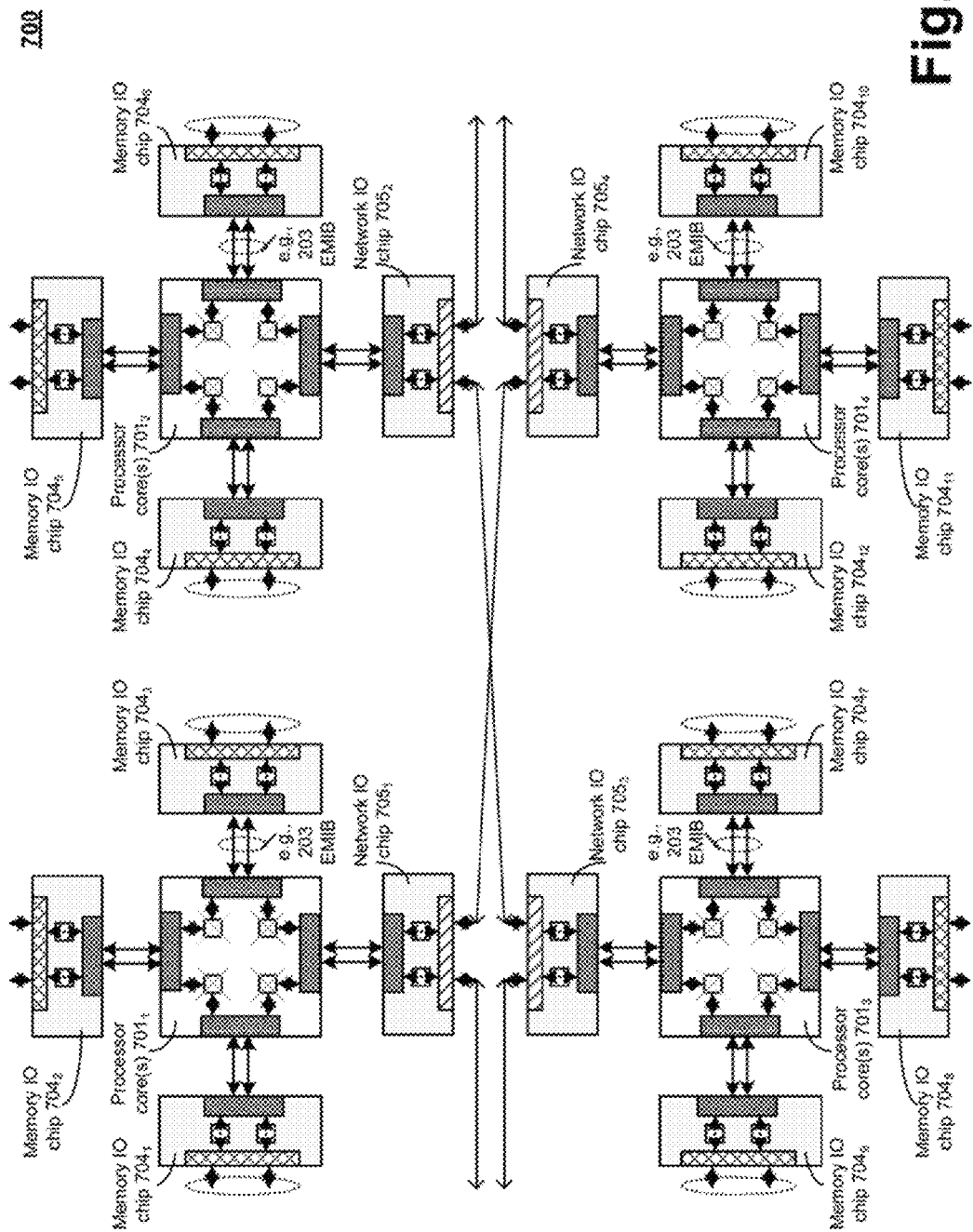
FIG. 7 illustrates an apparatus showing a 4:12:4, in accordance with some embodiments of the disclosure.

FIG. 7 illustrates apparatus 700 showing a 4:12:4 high memory bandwidth configuration, according to some embodiments. It is pointed out that those elements of FIG. 7 having the same reference numbers (or names) as the elements of any other figure can operate or function in any manner similar to that described, but are not limited to such.

In some embodiments, memory configurations such as FIG. 1 may add latency for signals travelling from East to West, or memory bandwidth may be insufficient for compute cores running specific application. To reduce that latency or provide higher memory bandwidth to compute cores, Memory IO chips may be arranged around processing cores while Network IO chips may be arranged such that they are cross-coupled to one another, in accordance with some embodiments. One such embodiment is illustrated by apparatus 700. In some embodiments, apparatus 700 is a high bandwidth memory configuration which includes four NoCs with processor cores $701_{1-4}$ (e.g., first dies), twelve Memory IO chips $704_{1-12}$, and four Network IO chips $705_{1-4}$ coupled together as shown. In some embodiments, the various dies are coupled together via package-level interconnect 203 as shown.

Figure 8:
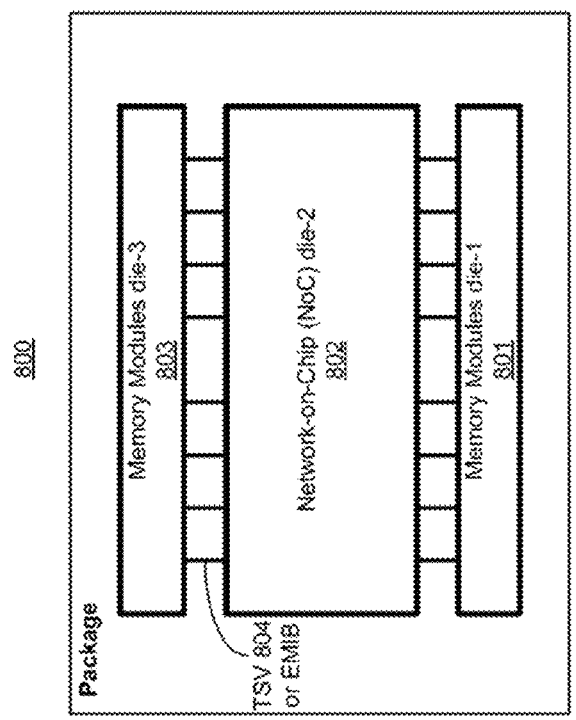
FIG. 8 illustrates a polylithic package having NoCs with processing cores and memory modules, in accordance with some embodiments.

FIG. 8 illustrates a polylithic package 800 having NoCs with processing cores, and memory modules, in accordance with some embodiments. It is pointed out that those elements of FIG. 8 having the same reference numbers (or names) as the elements of any other figure can operate or function in any manner similar to that described, but are not limited to such.

In some embodiments, polylithic package 800 includes Memory Modules 801 (e.g., die-1), NoC die 802 (e.g., die-2), and Memory Modules 803 (e.g., die-3). In some embodiments, NoC die 802 comprises any arrangement of dies such arrangements illustrated in FIGS. 2-7. Referring back to FIG. 8, in some embodiments, the Memory IO chips of NoC die 802 are arranged along opposite sides of NoC die 802 so that the Memory IO chips can couple to Memory Modules via package-level interconnect 804 (e.g., EMIB). In other embodiments, other arrangements of Memory Modules can be made. In some embodiments, the Memory Modules are a group of volatile or nonvolatile memory cells/banks. For example, Memory Modules 801 and 803 are one or more of dynamic random access memories (DRAMs), magnetic RAMs (MRAMs), NAND flash memory, etc.

In some embodiments, the memories in Memory Modules 801 and 803 are fabricated on different process technology nodes than dies of NoC 802. In some embodiments, dies of NoC 802 may be fabricated on different process technology nodes. In some embodiments, all dies are fabricated on the same process technology node.

Figure 9:
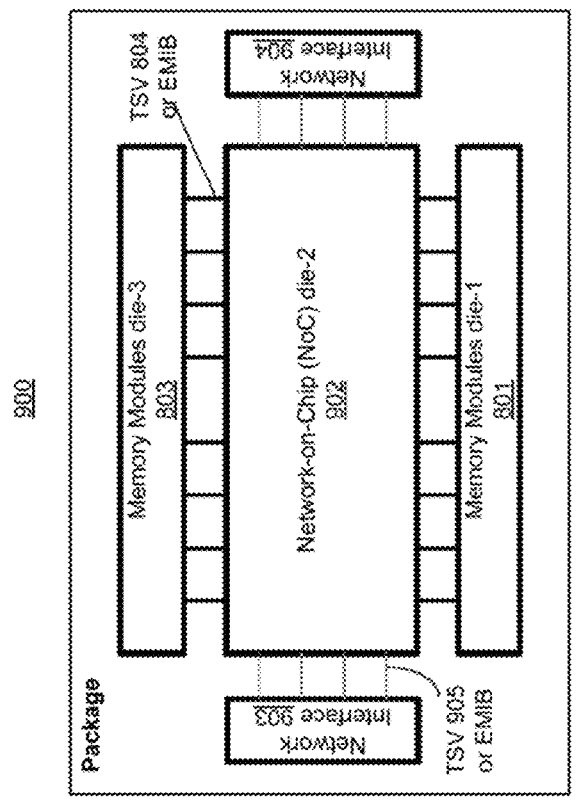
FIG. 9 illustrates a polylithic package having heterogeneous NoCs with processing and accelerator cores, memory modules, and network interfaces, in accordance with some embodiments.

FIG. 9 illustrates a polylithic package 900 having heterogeneous NoCs with processing and accelerator cores, memory modules, and network interfaces, in accordance with some embodiments. It is pointed out that those elements of FIG. 9 having the same reference numbers (or names) as the elements of any other figure can operate or function in any manner similar to that described, but are not limited to such.

In some embodiments, polylithic package 900 includes Memory Modules 801 (e.g., die-1), NoC die 902 (e.g., die-2), Memory Modules 803 (e.g., die-3), and Network interfaces 903 and 904. In some embodiments, NoC die 902 comprises any arrangement of dies such arrangements illustrated in FIGS. 2-7. Referring back to FIG. 9, in some embodiments, the Memory 10 chips of NoC die 902 are arranged along opposite sides of NoC die 902 so that the Memory 10 chips can couple to Memory Modules via package-level interconnect 804 (e.g., EMIB). In some embodiments, the Network 10 chips of NoC die 902 are arranged along opposite sides of NoC die 902 so that the Network 10 chips can couple to Network interfaces 903 and 904 via package-level interconnect 905 (e.g., EMIB). In other embodiments, other arrangements of Memory Modules and Network interfaces can be made.

Figure 10:
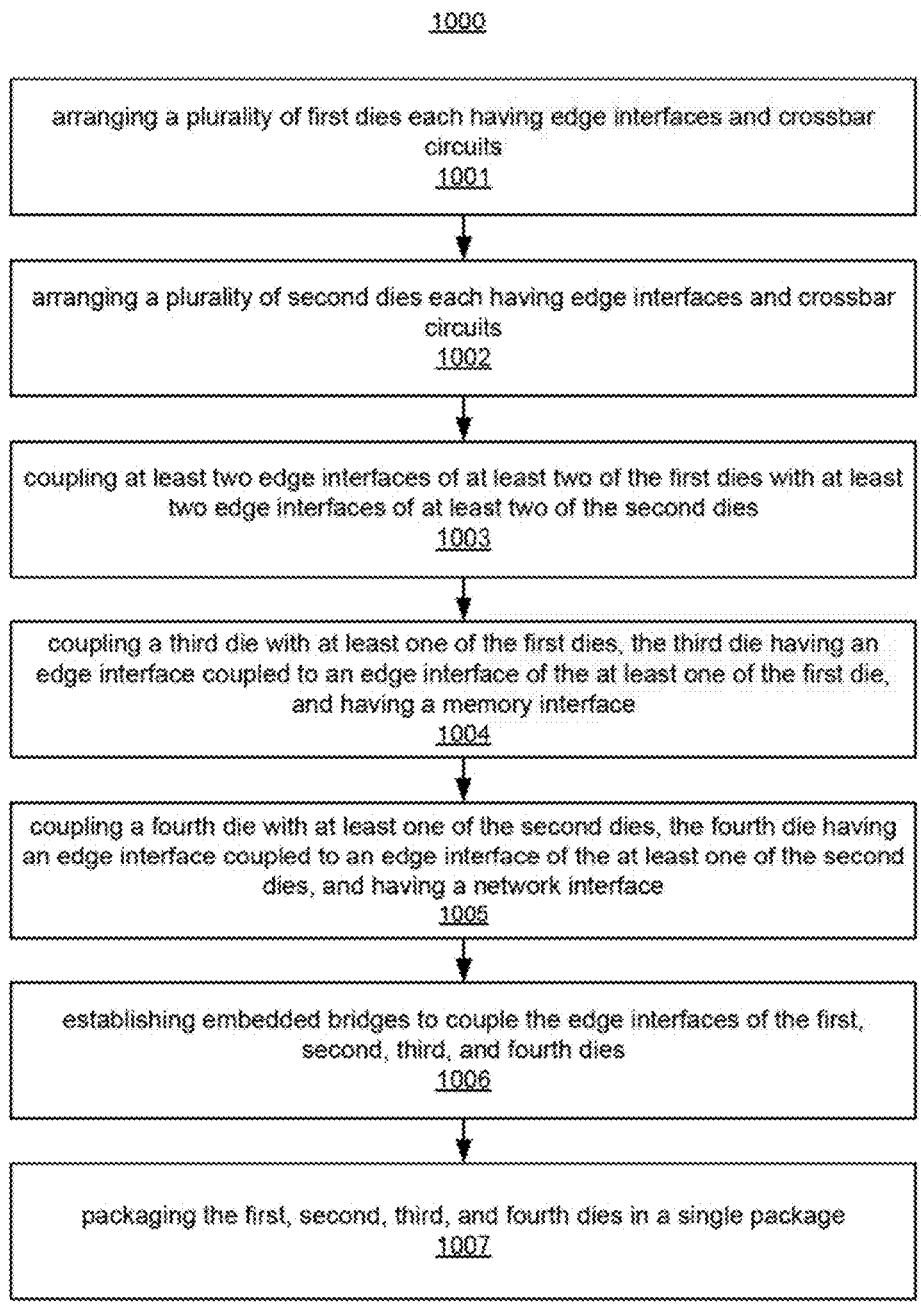
FIG. 10 illustrates a flowchart of a method for configuring a polylithic package having heterogeneous NoCs, according to some embodiments of the disclosure.

FIG. 10 illustrates flowchart 1000 of a method for configuring a polylithic package having heterogeneous NoCs, according to some embodiments of the disclosure. It is pointed out that those elements of FIG. 10 having the same reference numbers (or names) as the elements of any other figure can operate or function in any manner similar to that described, but are not limited to such.

Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1001, a plurality of first dies (e.g., processor cores) are arranged according to a desired configuration. Examples of some configurations are illustrated in FIGS. 2-7. Referring back to FIG. 10, each of the first dies includes standardized edge interfaces 104 and crossbar switches (or circuits) 101, in accordance with some embodiments. At block 1002, a plurality of second dies (e.g., accelerator cores) are arranged according to a desired configuration. Examples of some configurations are illustrated in FIGS. 2-7. Referring back to FIG. 10, each of the second dies includes standardized edge interfaces 104 and crossbar switches (or circuits) 101, in accordance with some embodiments. In some embodiments, first and second dies are formed on different silicon substrates. In some embodiments, first and second dies are formed on the same silicon substrates. In some embodiments, first and second dies are fabricated using different process technology nodes.

At block 1003, one or more standardized edge interfaces of the at least two of the first dies are coupled to one or more standardized edge interfaces of the at least two of the second dies. In some embodiments, the coupling of the standardized edge interfaces is implemented via package-level interconnect.

At block 1004, a third die (e.g., Memory IO chip) is coupled with at least one of the first dies. In some embodiments, the third die has a standardized edge interface which allows the third die to couple to the first die via the standardized edge interface of the first die. In some embodiments, the third die has a memory interface which allows the third die to couple to a memory (e.g., Memory Modules 801).

At block 1005, a fourth die (e.g., Network IO chip) is coupled with at least one of the second dies. In some embodiments, the fourth die has a standardized edge interface which allows the fourth die to couple to the second die via the standardized edge interface of the second die. In some embodiments, the fourth die has a network interface which allows the fourth die to couple to a Network Interface (e.g., 903). At block 1006, the standardized edge interfaces of each die are coupled to each other by establishing embedded bridges (e.g., EMIB). At block 1007, the first, second, third, and fourth dies are packaged in a single package.

Figure 11:
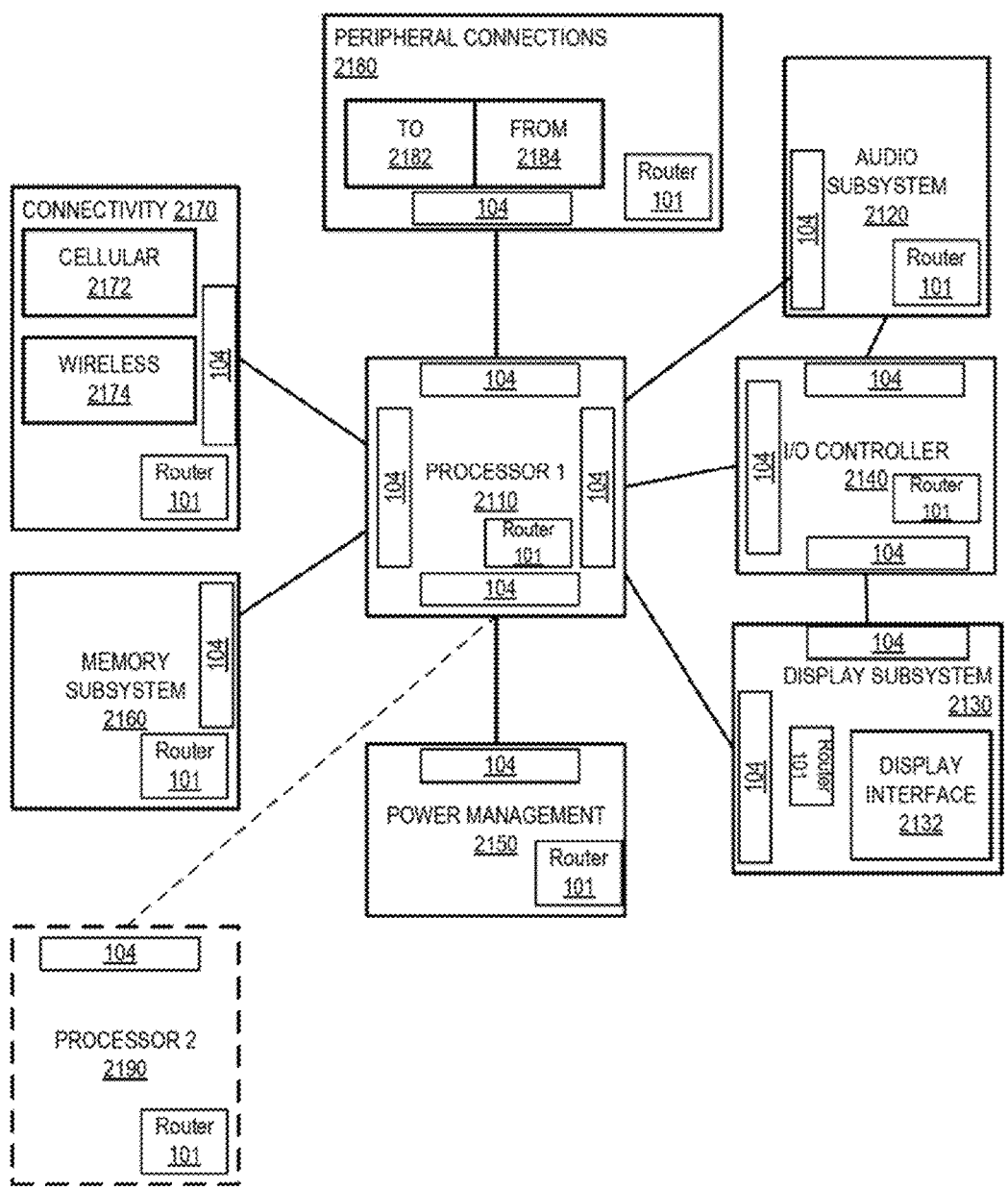
FIG. 11 illustrates a smart device or a computer system or a SoC (System-on-Chip) with a NoC, according to some embodiments.

FIG. 11 illustrates a smart device or a computer system or a SoC (System-on-Chip) 2100 with a NoC having router(s) 101 and standardized interface(s) 104, according to some embodiments. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with router(s) 101 and standardized interface(s) 104, according to some embodiments discussed. Other blocks of the computing device 2100 may also include=router(s) 101 and standardized interface(s) 104, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110. In some embodiments, audio subsystem 2120 includes Routers 101 having scalable floorplans, according to some embodiments.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user. In some embodiments, display subsystem 2130 includes Routers 101 having scalable floorplans, according to some embodiments.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices. In some embodiments, I/O controller 2140 includes Routers 101 having scalable floorplans, according to some embodiments.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. In some embodiments, power management 2150 includes crossbar circuits 102 with scalable floorplan, according to some embodiments. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In some embodiments, memory subsystem 2160 includes Routers 101 having scalable floorplan, according to some embodiments.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices. In some embodiments, connectivity 2170 includes Routers 101 having scalable floorplan, according to some embodiments.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems. In some embodiments, peripheral connections 2180 2120 includes Routers 101 having scalable floorplan, according to some embodiments.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first die including: a processing core; a crossbar switch coupled to the processing core; and a first edge interface coupled to the crossbar switch; and a second die including: a first edge interface positioned at a periphery of the second die and coupled to the first edge interface of the first die, wherein the first edge interface of the first die and the first edge interface of the second die are positioned across each other; a clock synchronization circuit coupled to the second edge interface; and a memory interface coupled to the clock synchronization circuit.

In some embodiments, the first edge interface of the first die and the first edge interface of the second are coupled via a package-level interconnect. In some embodiments, the package-level interconnect is an embedded bridge. In some embodiments, the package-level interconnect is a high density interposer. In some embodiments, processing core of the first die is one of a compute core or an accelerator. In some embodiments, the second die is a memory input-output (IO) die. In some embodiments, each of the first edge interfaces of the first and second dies comprise an inverter.

In some embodiments, the clock synchronization circuit is to enable clock domain transitions across the memory interface and the first edge interface of the second die. In some embodiments, the apparatus comprises: a third die including: a processing core; a crossbar switch coupled the processing core; a first edge interface, coupled to the crossbar switch, positioned at a periphery of the third die; and a first edge interface coupled to a second edge interface of the first die, the first edge interface of the third die and the second edge interface of the first die are positioned across each other.

In some embodiments, the first edge interface of the third die and the second edge interface of the first die are coupled via a package-level interconnect. In some embodiments, the apparatus comprises: a fourth die including: a first edge interface positioned at a periphery of the fourth die and coupled to a second edge interface of the third die, wherein the first edge interface of the fourth die and the second edge interface of the third die are positioned across each other; a clock synchronization circuit coupled to the first edge interface of the fourth die; and a network interface coupled to the clock synchronization circuit.

In some embodiments, at least one of the first, second, third, and fourth dies is manufactured on a first process technology node and wherein at least one of the first, second, third, and fourth dies is manufactured on a second process technology node different from the first process technology node. In some embodiments, the second edge interface of the third die and the first edge interface of the fourth die are coupled via a package-level interconnect. In some embodiments, the first, second, third, and fourth dies share a silicon substrate.

In some embodiments, at least two of the first, second, third, and fourth dies have separate substrates. In some embodiments, the first, second, third, and fourth dies are packaged in a single package. In some embodiments, the fourth die is a network input-output (IO) die. In some embodiments, the clock synchronization circuit of the fourth die is to enable clock domain transitions across the network interface and the first edge interface of the fourth die.

In another example, a method is provided which comprises: arranging a plurality of first dies each having edge interfaces and crossbar switches; arranging a plurality of second dies each having edge interfaces and crossbar switches; coupling one or more edge interfaces of at least two of the first dies with one or more edge interfaces of at least two of the second dies; coupling a third die with at least one of the first dies, the third die having an edge interface coupled to an edge interface of the at least one of the first die, and having a memory interface; and coupling a fourth die with at least one of the second dies, the fourth die having an edge interface coupled to an edge interface of the at least one of the second dies, and having a network interface.

In some embodiments, coupling the one or more edge interfaces of the at least two of the first dies with the one or more edge interfaces of the at least two of the second dies comprises: establishing at least two embedded bridges between the at least two edge interfaces of the at least two of the first dies and the at least two edge interfaces of the at least two of the second dies. In some embodiments, the method comprises packaging the first, second, third, and fourth dies in a single package. In some embodiments, the method comprises establishing embedded bridges to couple the edge interfaces of the first, second, third, and fourth dies.

In another example, a system is comprises a memory chip; a network fabric; a package having pins for coupling to the memory chip and the network fabric, the package including: a first die including: a processing core; a crossbar switch coupled to the processing core; and a first edge interface coupled to the crossbar switch; and a second die including: a first edge interface positioned at a periphery of the second die and coupled to the first edge interface of the first die, wherein the first edge interface of the first die and the first edge interface of the second die are positioned across each other; a clock synchronization circuit coupled to the second edge interface; and a memory interface coupled to the clock synchronization circuit, the memory interface is to allow the package to couple to the memory.

In some embodiments, the package comprises: a third die including: a processing core; a crossbar switch coupled the processing core; a first edge interface, coupled to the crossbar switch, positioned at a periphery of the third die; and a first edge interface coupled to a second edge interface of the first die, the first edge interface of the third die and the second edge interface of the first die are positioned across each other. In some embodiments, the package comprises: a fourth die including: a first edge interface positioned at a periphery of the fourth die and coupled to a second edge interface of the third die, wherein the first edge interface of the fourth die and the second edge interface of the third die are positioned across each other; a clock synchronization circuit coupled to the first edge interface of the fourth die; and a network interface coupled to the clock synchronization circuit, wherein the network interface is to allow the package to couple to the network fabric.

In some embodiments, the first die is a general purpose processor, wherein the second die is a memory input-output chip, and wherein the third die is an accelerator chip, and wherein the fourth die is a network input-output chip. In some embodiments, the network fabric is at least one of the communication fabrics: Peripheral Component Interconnect Express (PCIe), Ethernet, or Optical interface.

In another example, an apparatus is provided which comprises: means for arranging a plurality of first dies each having edge interfaces and crossbar switches; means for arranging a plurality of second dies each having edge interfaces and crossbar switches; means for coupling one or more edge interfaces of at least two of the first dies with one or more edge interfaces of at least two of the second dies; means for coupling a third die with at least one of the first dies, the third die having an edge interface coupled to an edge interface of the at least one of the first die, and having a memory interface; and means for coupling a fourth die with at least one of the second dies, the fourth die having an edge interface coupled to an edge interface of the at least one of the second dies, and having a network interface.

In some embodiments, the means for coupling the one or more edge interfaces of the at least two of the first dies with the one or more edge interfaces of the at least two of the second dies comprises: means for establishing at least two embedded bridges between the at least two edge interfaces of the at least two of the first dies and the at least two edge interfaces of the at least two of the second dies. In some embodiments, the apparatus comprises means for packaging the first, second, third, and fourth dies in a single package. In some embodiments, the apparatus comprises means for establishing embedded bridges to couple the edge interfaces of the first, second, third, and fourth dies.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first die including:
        a processing core;
        a crossbar switch coupled to the processing core; and
        a first edge interface coupled to the crossbar switch; and
    a second die including:
        a first edge interface positioned at a periphery of the second die and coupled to the first edge interface of the first die, wherein the first edge interface of the first die and the first edge interface of the second die are positioned across each other;
        a clock synchronization circuit coupled to the second edge interface; and
        a memory interface coupled to the clock synchronization circuit, wherein the clock synchronization circuit includes circuitry to enable clock domain transitions across the memory interface and the first edge interface of the second die.

2. The apparatus of claim 1, wherein the first edge interface of the first die and the first edge interface of the second die are coupled via a package-level interconnect.

3. The apparatus of claim 2, wherein the package-level interconnect is an embedded bridge.

4. The apparatus of claim 2, wherein the package-level interconnect is a high density interposer.

5. The apparatus of claim 1, wherein the processing core of the first die is one of a compute core or an accelerator.

6. The apparatus of claim 1, wherein the second die is a memory input-output (IO) die.

7. The apparatus of claim 1, wherein each of the first edge interfaces of the first and second dies comprise an inverter.

8. The apparatus of claim 1 comprises:
    a third die including:
        a processing core;
        a crossbar switch coupled the processing core;
        a first edge interface, coupled to the crossbar switch, positioned at a periphery of the third die; and
        a first edge interface coupled to a second edge interface of the first die, the first edge interface of the third die and the second edge interface of the first die are positioned across each other.

9. The apparatus of claim 8, wherein the first edge interface of the third die and the second edge interface of the first die are coupled via a package-level interconnect.

10. The apparatus of claim 8 comprises:
    a fourth die including:
        a first edge interface positioned at a periphery of the fourth die and coupled to a second edge interface of the third die, wherein the first edge interface of the fourth die and the second edge interface of the third die are positioned across each other;
        a clock synchronization circuit coupled to the first edge interface of the fourth die; and
        a network interface coupled to the clock synchronization circuit.

11. The apparatus of claim 10, wherein at least one of the first, second, third, or fourth dies is manufactured on a first process technology node and wherein at least another one of the first, second, third, or fourth dies is manufactured on a second process technology node different from the first process technology node.

12. The apparatus of claim 10, wherein the second edge interface of the third die and the first edge interface of the fourth die are coupled via a package-level interconnect.

13. The apparatus of claim 10, wherein the first, second, third, and fourth dies share a silicon substrate.

14. The apparatus of claim 10, wherein at least two of the first, second, third, and fourth dies have separate substrates.

15. The apparatus of claim 10, wherein the first, second, third, and fourth dies are packaged in a single package.

16. The apparatus of claim 10, wherein the fourth die is a network input-output (IO) die.

17. The apparatus of claim 10, wherein the clock synchronization circuit of the fourth die is operable to enable clock domain transitions across the network interface and the first edge interface of the fourth die.

* * * * *